(12) United States Patent
Sachdev et al.

(10) Patent No.: US 6,221,269 B1
(45) Date of Patent: Apr. 24, 2001

(54) METHOD OF ETCHING MOLYBDENUM METAL FROM SUBSTRATES

(75) Inventors: Krishna G. Sachdev; Umar M. Ahmad, both of Hopewell Junction; Hsing H. Chen, Poughkeepsie, all of NY (US); Lawrence D. David, Amherst, NH (US); Charles H. Perry; Donald R. Wall, both of Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/233,384

(22) Filed: Jan. 19, 1999

(51) Int. Cl.$^7$ .................................................. C03C 15/00
(52) U.S. Cl. .............................. 216/101; 216/13; 216/92; 134/2; 134/1.3; 438/754
(58) Field of Search .............................. 216/13, 92, 100, 216/101; 134/1.3, 2; 438/750, 754

(56) References Cited

U.S. PATENT DOCUMENTS 4,113,551  9/1978  Bassous et al. .
4,776,892  10/1988  Steppkan et al. .
5,518,131  5/1996  Chen et al. .

*Primary Examiner*—Richard Bueker
*Assistant Examiner*—Erin Fieler
(74) *Attorney, Agent, or Firm*—DeLio & Peterson; John J. Tomaszewski; Aziz M. Ahsan

(57) ABSTRACT

A method is provided for etching and removing extraneous molybdenum or debris on ceramic substrates such as semiconductor devices and also for molybdenum etching in the fabrication of molybdenum photomasks. The method employs a multi-step process using an acidic aqueous solution of a ferric salt to remove (etch) the molybdenum debris followed by contacting the treated substrate with an organic quaternary ammonium hydroxide to remove any molybdenum black oxides which may have formed on the exposed surface of treated molybdenum features in ceramic substrates. The method is environmentally safe and the waste solutions may be easily waste treated for example by precipitating the ferric salts as ferric hydroxide and removing anions such as sulfate by precipitation with lime. The method replaces the currently used method of employing ferricyanide salts which create serious hazardous waste disposal and environmental problems.

16 Claims, 1 Drawing Sheet

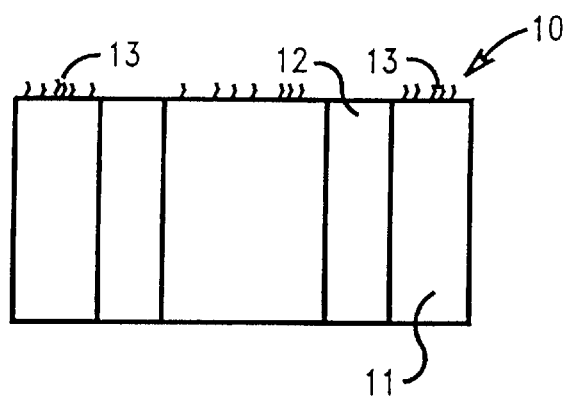
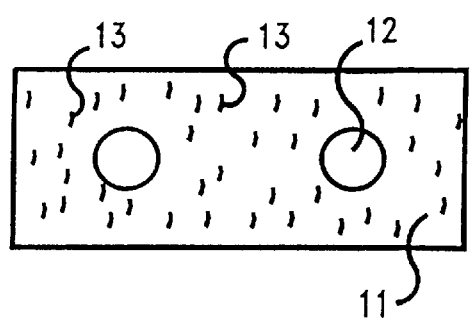
FIG. 1A　　　　　FIG. 1B
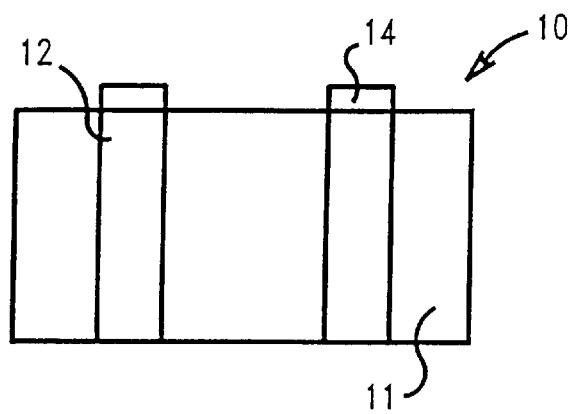
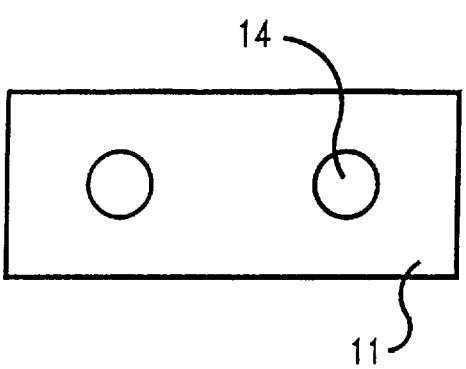
FIG. 2A　　　　　FIG. 2B
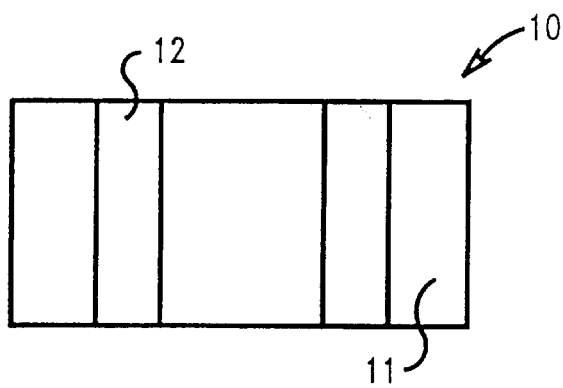
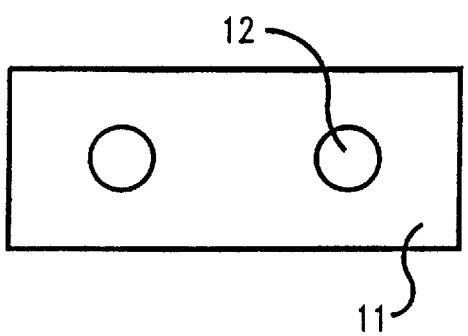
FIG. 3A　　　　　FIG. 3B

METHOD OF ETCHING MOLYBDENUM METAL FROM SUBSTRATES

BACKGROUND OF THE INVENTION

1. Field of the Invention

This invention relates generally to the removal of molybdenum (Mo) metal from substrates by etching such as the removal of Mo metal debris from surfaces such as ceramic and metal feature surfaces of sintered ceramic substrates in the fabrication of ceramic electronic components containing molybdenum circuitry and in the fabrication of molybdenum photomasks. In particular, this invention is concerned with an environmentally friendly process for removal of extraneous molybdenum metal debris from substrates involving a Mo etching step and an oxide removal step to strip a black oxide surface layer formed on the metal features during the etching step.

2. Description of Related Art

Production of ceramic substrates such as alumina multilayer ceramics with interconnected metal vias for packaging semiconductor devices requires screening of an electrically conductive paste such as a metal-polymer composite paste through a mask, such as a metal mask, to deposit conductive patterns onto ceramic green sheets. After screening, the green sheets are dried, assembled, laminated, cut to size, and the laminates are sintered. A commonly used conductive paste used in alumina ceramic substrate technology is a molybdenum metal based paste which is a dispersion of molybdenum metal powder in an organic binder, such as, for example, ethyl cellulose, polymethyl methacrylate, and the like, a high boiling solvent vehicle system in conjunction with plasticizers, dispersants/surfactants, and other conventional additives. It is generally observed that the as-processed sintered ceramic substrates have the problem of varying levels of lodged-in extraneous Mo metal debris as particles or flakes on the surface of the ceramic dielectric and also on the sintered Mo metal conductive features. A pre-clean step prior to further processing, for example, deposition of joining metallurgy, is therefore a standard part of the overall process. FIG. 1A shows a ceramic substrate containing Mo metal filled vias and in which extraneous Mo is on the ceramic surface. It is the Mo debris on the sintered ceramic surface which must be removed to provide a substrate suitable for subsequent operations.

A commonly used pre-clean process involves vapor blast or bead blast treatment of sintered parts followed by contacting with a potassium ferricyanide (K3[Fe(CN)6])/KOH solution at high pH (about 13) to etch extraneous Mo from the substrate surface. Potassium ferricyanide at high pH is an efficient etchant for Mo metal which has no problem of oxidation of Mo or black via formation and is a standard etchant in the fabrication of Mo metal masks for screening conductive paste on substrates. However, the use of potassium ferricyanide in production scale processes, causes environmental issues with the etch bath solution handling and disposal of cyanide contaminated waste as cyanide carrying iron complexes. The waste issue can be partially addressed by using recycling technologies, such as etchant bath regeneration by oxidation with ozone, thus minimizing etch waste but there is still a disposal problem with large volumes of cyanide-contaminated rinse water.

U.S. Pat. 5,518,131 (Chen et al.) describes an alternate method for etching molybdenum in metal mask fabrication that utilizes ferric sulfate or ferric ammonium sulfate as etchants as a replacement of ferricyanide. These reagents provide Mo etch rates comparable to ferricyanide under optimized process conditions and at the same time have the advantage of having a non-hazardous easily treatable waste.

It has been found, however, that when using ferric sulfate or ferric nitrate or ferric ammonium sulfate aqueous solutions for removal of extraneous Mo from ceramic substrates, the etch removal of Mo debris is accompanied by accumulation of a passivating layer as a black deposit of complex hydrated Mo oxides or polymolybdates on the surface of via metallurgy. Such an oxide layer on the surface of conductive features is undesirable as it interferes with subsequent processing for example, deposition of follow-on joining metallurgy metal, thus impacting process viability for a functional electronic packaging component.

In the case of Mo etching at high pH(>12) as with the potassium ferricyanide/KOH reagent, the alkali metal molybdate formed in the etch process remains soluble in strongly alkaline solution. With ferric sulfate or ferric nitrate, on the other hand, the reagent solution pH is maintained below 1 or preferably below 0.5 to prevent gelling of iron hydrates during Mo etching. At low pH, the initially formed molybdate ($MoO_4$) undergoes in-situ self condensation to form complex oxides or polymolybdates which passivate the surface of molybdenum features such as metal vias resulting in a dark or black deposit on Mo metallurgical features.

With the above recited problems that are associated with Mo etching or removal using low pH etch reagents, such as ferric sulfate, ferric nitrate, and related materials, a need exists for a non-cyanide method to remove frozen or lodged in molybdenum debris from substrates such that the method does not suffer from the black via problem.

Bearing in mind the problems and deficiencies of the prior art, it is therefore a purpose of the present invention to provide a method for removing extraneous Mo from substrates using a non-cyanide containing etchant without damaging the Mo features on the substrate.

Another object of this invention is to provide an environmentally friendly method for removal of extraneous Mo from a ceramic substrate surface which does not leave a dark surface layer on the Mo metal features of the multilayer ceramic substrate which would interfere with follow-on joining metallurgy.

Another object of this invention is to provide molybdenum-containing electronic components such as semiconductors, metal masks, photomasks used to make electronic components, and the like using the method of this invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in one first aspect, a method for etching (removing) from electronic component substrates, such as semiconductors, extraneous molybdenum deposited on the substrate in the fabrication of ceramic chip carriers, etc. comprising:

supplying a metal containing ceramic substrate comprising typically multilayers of ceramic having a metal such as molybdenum circuitry thereon with the multilayers being interconnected with vias and the substrate carrying lodged in molybdenum debris on the substrate surface;

contacting the extraneous metal (molybdenum) containing substrate with a non-cyanide aqueous ferric salt strongly acidic solution having an acidic pH preferably less than about 2 and more preferably less than about 0.5 for an effective time to remove the desired amount of molybdenum debris on the ceramic substrate surface;

rinsing preferably with deionized water;

preferably drying in an inert atmosphere such as nitrogen;

contacting the ferric salt treated substrate for an effective time with an aqueous solution of an organic quaternary ammonium hydroxide, preferably tetramethyl ammonium hydroxide (TMAH), to provide the etched substrate which is substantially free of Mo oxide;

rinsing preferably with deionized water;

preferably drying in an inert atmosphere such as nitrogen.

In another aspect of the invention, the molybdenum etchants include ferric nitrate, ferric sulfate and ferric ammonium sulfate. The organic quaternary ammonium hydroxide is preferably tetramethyl ammonium hydroxide (TMAH) and the preferred compounds can be represented by the formula:

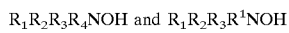

$R_1R_2R_3R_4NOH$ and $R_1R_2R_3R^1NOH$ wherein each $R_1$, $R_2$, $R_3$ and $R_4$ is the same or different and are selected from an organic radical of the type $C_nH_{2n+1}$, where n is an integer 1 to 8, preferably 1–4, and most preferably 1, and $R^1$ is $C_nH_{2n}$ X, where n is 1 to 2 and X is OH.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1A is a side elevational cross-sectional view of a ceramic substrate having Mo filled vias and containing extraneous Mo on the ceramic surface.

FIG. 1B is a top plan view of FIG. 1A.

FIG. 2A is a side elevational cross-sectional view of the ceramic substrate of FIG. 1A having Mo filled vias and a black oxide on the Mo via surface after the first step of the method of the invention.

FIG. 2B is a top plan view of 2A.

FIG. 3A is a side elevational cross-sectional view of the ceramic substrate of FIGS. 1A and 2A having Mo filled vias which has been cleaned using the method of the invention.

FIG. 3B is a top plan view of FIG. 3A.

DESCRIPTION OF THE PREFERRED EMBODIMENT(S)

Molybdenum is used for a number of applications in electronic components including semiconductor electronic component fabrication. For example, molybdenum is used to fabricate the light shielding patterns on photomasks for defining an electronic pattern on a substrate. Molybdenum is also used to form the circuitry for semiconductor electronic components including the circuit lines and pads on a ceramic surface. In the preparation of multilayer ceramic semiconductor packaging structures, the well-known green sheet casting process is used and the green sheets after the via punching operation are screened with a metallic paste, for example Mo paste, by extrusion of the paste through a mask onto the surface of the green sheets. The mask is typically a molybdenum foil mask and the paste is typically a molybdenum paste which is screened through the mask. Other metals such as Ni—Cu—Ni electroform masks may also typically be used and the resulting semiconductors treated according to the present invention.

In the fabrication of multilayer ceramic substrates, the screened green sheets are laminated and the laminates are sintered. The sintered parts may contain extraneous Mo metal debris on ceramic and moly features which are conventionally removed by a pre-clean step using potassium ferricyanide/KOH in an aqueous solution at pH >12, prior to subsequent formation of joining metallurgy. The problem is that the potassium ferricyanide etch process presents associated hazard and environmental issues due to the poisoning nature of cyanide and cyanide contaminated wastewater disposal.

According to this invention, it has been found that the standard ferricyanide based pre-cleaning process can be readily replaced by a new non-hazardous method comprising etching of the substrate with a low pH ferric salt aqueous solution to remove Mo debris followed by treatment of the etched substrate with an aqueous solution of a quaternary ammonium hydroxide such as TMAH. The later treatment has been found to unexpectedly remove the black oxide layers on metal features formed on the Mo features in the preceding acidic pH ferric salt based etching reagent treatment step. The TMAH step is preferably performed within about 2 hours, preferably 1 hour and most preferably immediately, e.g., less than 15 minutes after the ferric salt step.

Several other reagent solutions tested for treatment instead of a TMAH solution for removal of black oxide deposit include: aqueous solutions of KOH and NaOH, sodium metasilicate, triethanolamine, ammonium hydroxide, sodium citrate/NaOH, and also aqueous mineral acids typically 5% $H_2SO_4$ and 5% HCl. None of these solutions were found effective in removing the black oxide deposit on Mo features which is indicative of the uniqueness of a quaternary ammonium hydroxide, particularly tetramethyl ammonium hydroxide $((CH_3)_4NOH)$ as disclosed according to this invention. Strong acid treatment such as 23% HCl at 50–70° C. removes the black oxide only partially and also causes dimensional change in the conductive via pattern.

U.S. Pat. No. 4,113,551 to Bassous et al. describes the use of aqueous TMAH for etching polycrystalline silicon. U.S. Pat. 4,776,892 to Steppan et al. describes the use of an organic quarternary ammonium hydroxide to strip light-hardened photoresist layers and the disclosures of both patents are incorporated herein by reference.

The first step in the process for removal of extraneous metal according to this invention is to use a low pH etchant aqueous solution wherein the etchant is selected from a group of non-cyanide Mo etchant ferric salts such as, for example, ferric nitrate, ferric sulfate and ferric ammonium sulfate. An aqueous solution of the salt is prepared comprising, by weight, about 5 to 35% or more ferric salt, e.g., up to its solubility limit, preferably 10 to 30% and most preferably 10 to 20% because of its demonstrated effectiveness.

The part or substrate to be cleaned of Mo debris is immersed in a preferably constantly stirred ferric salt aqueous solution for an effective time such as about 0.5–5 minutes or more, preferably about 0.5 to 1.5 minutes. It is preferred to agitate or stir the solution during substrate immersion to provide continuous flow of etching solution. Alternatively, the aqueous solution of the ferric salt can be sprayed onto the substrate for the desired time interval. The solution is preferably kept at room temperature although elevated temperatures up to about 50° C. or above may be employed. After the cleaning or etching step with the ferric salt solution, the etched component is rinsed preferably in deionized water and preferably dried using an inert gas such as nitrogen, and then preferably immediately immersed in an organic quaternary ammonium hydroxide aqueous solution with preferably constant agitation, immediately (preferably less than 15 minutes, more preferably less than 5 minutes) rinsed preferably with deionized water and dried preferably with an inert gas such as nitrogen.

The organic quaternary ammonium hydroxide aqueous solution may be any suitable concentration typically about 0.05N up to 1N (about 0.45 to 9.1 wt. %) or more, preferably about 0.1N to 0.5N (about 0.9–4.5 wt. %) and most preferably 0.15N to 0.25N (about 1.36–2.27 wt. %). Normality is defined as gram equivalents (or equivalent weight in grams) per liter of solution. For example, with TMAH (($CH_3$)$_4$NOH), the molecular weight is 91 which is also the equivalent weight. The parts are treated with tetramethyl ammonium hydroxide aqueous solution at room temperature for up to about 2 minutes or more typically for about 30–45 seconds. Elevated temperatures may also be employed. After treating with the tetramethyl ammonium hydroxide solution, the component or part is immediately (preferably less than 15 minutes, more preferably less than 5 minutes) rinsed preferably in deionized water and preferably dried with an inert gas such as nitrogen.

The quaternary ammonium bases used in accordance with the present invention are preferably aliphatic quaternary ammonium hydroxides, in particular tetraalkyl ammonium hydroxides represented by the formula:

where $R_1R_2R_3$ and $R_4$ are the same or different and are selected from the group consisting of an organic radical $C_nH_{2n+1}$ with n=1–4. Another quaternary ammonium hydroxide is wherein $R_1R_2$ and $R_3$ are alkyl groups, preferably the same methyl group, and $R_4$ is a substituted alkyl group, e.g., a hydroxyalkyl group. Among these, the compounds containing alkyl groups having 1 to 8, particularly 1 to 4 carbon atoms are preferred. One or more of such alkyl groups can be substituted by functionalized alkyl groups, e.g., hydroxy ethyl ($CH_2CH_2OH$) as in trimethyl hydroxyethyl ammonium hydroxide. It is also possible for some of the alkyl groups to be replaced by alkenyl groups. The preferred organic quaternary ammonium hydroxides are the tetraalkyl ammonium hydroxides having alkyl groups of 1 to 4 carbon atoms with the preferred base being tetramethyl ammonium hydroxide (TMAH).

Referring now to the figures, FIGS. 1A and 1B show an electronic component generally as 10. The electronic component is made of a ceramic substrate 11 and molybdenum vias 12. On the surface of the ceramic layer is molybdenum debris 13. The molybdenum debris is a result of the processing operation and is the debris which is to be removed by the process of the invention.

FIGS. 2A and 2B show the electronic component 10 after etching with a ferric salt of the invention. Thus, the ceramic substrate 11 is now free of molybdenum debris but the molybdenum vias 12 have an oxide layer 14 on the surface thereof. It is the oxide layer 14 on the molybdenum vias surface which is to be removed in the next step of the process of the invention.

Referring now to FIGS. 3A and 3B the electronic component 10 is shown after treatment using the process of the invention whereby molybdenum debris is removed from the component 10 without any significant molybdenum oxide left on the via surface. Thus, the electronic component 10 having the ceramic substrate 11 with molybdenum vias 12 can be seen in FIGS. 3A and 3B as having no significant molybdenum debris on the ceramic surface or molybdenum via surface.

The following examples are shown to describe the invention.

EXAMPLE 1

The following were carried out using Mo foil coupons in order to demonstrate removal rate of molybdenum metal by etching in ferric salt solutions and effectiveness of subsequent TMAH treatment to remove a black Mo oxide surface layer.

The ferric sulfate and ferric nitrate were aqueous solutions at varying concentrations. The second step aqueous TMAH solution was tested at different concentrations of TMAH and treatment times. The following examples are representative.

A 10%, 15% and 20% by weight aqueous solution of ferric sulfate (as $Fe_2(SO_4)_3$ was prepared by dissolving 24.5 g, 37.0 g, and 49.7 g of ferric sulfate pentahydrate ($Fe_2(SO_4)_3 \cdot 5 H2O$) respectively in deionized water to form 200 cc of solution.

Ferric nitrate ($Fe(NO_3)_3$) solutions were similarly prepared at 10%, 15% and 20% by weight.

A reference conventional etch solution of potassium ferricyanide was prepared comprising 200 g of potassium ferricyanide and 70 g KOH per liter of solution.

For comparative evaluation of Mo etch rates, 4×4 $cm^2$ coupons of 3 mil thick Mo foil were used. The coupons were cleaned by rinsing with acetone followed by rinsing with deionized water and then dried with $N_2$. The coupons were weighed to record initial weight, then exposed to the process steps disclosed in the invention, i.e., ferric sulfate (18 wt. %) and ferric nitrate (20 wt. %) solutions for 2–6 minutes at 23° C. (room temperature) followed by a water rinse and drying with $N_2$. The coupons were then immediately immersed in an about 1.8 weight % TMAH solution (0.2N) for 30–60 seconds followed by a water rinse and drying. The coupons were then weighed again and a weight loss due to etch of Mo was recorded.

For the controls using the potassium ferricyanide etching, weighed coupons were treated with the above cyanide solution for the same time intervals, rinsed with water and dried. The following data are representative and are shown in the table wherein the results are indicated as weight loss as mg weight loss/$cm^2$/side of Mo foil:

TABLE

| ETCH TIME (MINUTES) | $K_3Fe(CN)_6$ | $Fe(NO_3)_3$ | $Fe_2(SO_4)_3$ |
|---|---|---|---|
| 2 | 1.6 | 1.2 | 1.4 |
| 3 | 2.2 | — | 1.8 |
| 4 | 3.4 | 1.8 | 2.7 |
| 6 | 4.4 | 2.5 | — |

The data shows linearity of weight loss with time when potassium ferricyanide/KOH is used since no passivation layer is formed under high pH conditions. In the case of ferric nitrate and ferric sulfate where the pH is maintained at less than 1 during etching treatment, the weight loss is non-linear due to the formation of black oxide on the Mo with time which slows down the etch rate thus resulting in non-linear weight loss with time. Similar acceptable relative weight loss results were obtained with the above-noted ferric sulfate and ferric nitrate aqueous solutions and TMAH solutions.

EXAMPLE 2

Sintered ceramic substrates having molybdenum circuit metallization and extraneous molybdenum debris lodged thereon were precleaned by vapor blast followed by water rinse. To remove the extraneous Mo debris on ceramic and metal features, the cleansed substrates were immersed for 30–90 seconds in a rapidly stirred 15.2 weight percent aqueous solution of ferric sulfate (wt. % based on anhydrous $Fe_2(SO_4)_3$ by dissolving 19 g of $Fe_2(SO_4)_3 \cdot 5 H_2O$ in 100 cc of solution) at room temperature. The parts were then immediately rinsed in deionized water and dried with nitrogen. This step was immediately followed by immersion in 0.2N aqueous TMAH (which is about 1.8 weight %) at room temperature for 30–60 seconds, rinsed with deionized water and dried with forced nitrogen gas.

Visual and microscopic inspection of the parts show that extraneous molybdenum on the parts was removed and that the molybdenum features on the parts were shiny showing no residual black oxide layer, which was seen prior to the TMAH treatment.

This process described for removal of extraneous Mo from substrates can be applied for etching partially or completely Mo surface layers from other surfaces without having a black oxide problem.

The above used ferric sulfate waste solutions were effectively treated as follows. The ferric sulfate etch bath containing both ferrous and ferric ions was subjected to oxidation and ferric ($Fe^{+3}$) was precipitated as ferric hydroxide by increasing the pH of the solution to above about 11. The filtrate was then treated with lime to precipitate the sulfate as calcium sulfate. Both these precipitates are nontoxic, non-corrosive and non-poisonous. The TMAH containing waste waters from the oxide removal step were found to contain significant leads of dissolved moly as hydrated molyoxides. The dissolved metals as well as TMAH can be removed from the waste water to provide safely dischargeable water.

The process of removal of extranuous Mo metal from ceramic substrates disclosed according to this invention is characterized by the following advantages. The method is based on non-hazardous reagents and there are no substantial environmental regulatory issues. Extraneous Mo is removed as effectively as in the ferricyanide process. The new method of the invention has no significant problems of corrosive or poisonous residue of the waste product. The etching/waste solution and TMAH post-treatment waste waters can be readily treated to remove dissolved organics and metals and the waste water can be safely discharged.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:
1. A method for removing extraneous molybdenum metal from an electronic component semiconductor substrate by etching comprising:
supplying a sintered ceramic substrate containing molybdenum circuitry and carrying lodged extraneous molybdenum metal debris on the substrate surface;
treating the substrate with an aqueous solution of a ferric salt having a strongly acidic pH to etch and remove extraneous molybdenum;
rinsing the treated substrate with deionized water;
contacting the rinsed substrate with an aqueous solution of an organic quaternary ammonium hydroxide to remove a black deposit of oxide formed on the surface of the molybdenum metallurgical features during the ferric salt treatment step; and
rinsing the substrate with deionized water.

2. The method of claim 1 wherein the ceramic substrate is an alumina ceramic consisting of interconnected molybdenum metal features.

3. The method of claim 1 wherein the ferric salt is selected from the group of ferric sulfate, ferric nitrate and ferric ammonium sulfate.

4. The method of claim 1 wherein the ferric salt is ferric sulfate.

5. The method of claim 1 wherein the quarternary ammonium hydroxide is represented by the formula: $R_1R_2R_3R_4NOH$
wherein $R_1$, $R_2$, $R_3$ and $R_4$ are the same or different and are selected from the group consisting of an organic radical represented by the formula $C_nH_{2n+1}$ where n is an integer of 1–4.

6. The method of claim 1 wherein the quarternary ammonium hydroxide is aqueous tetramethyl ammonium hydroxide.

7. The method of claim 1 wherein the quarternary ammonium hydroxide is represented by the formula:

$R_1R_2R_3R^1NOH$ wherein $R_1R_2$ and $R_3$ are the same or different and are selected from the group consisting of an organic radical represented by the formula: $C_nH_{2n+1}$ and $R^1$ is a hydroxy alkyl radical represented by the formula $C_nH_{2n-OH}$ where n is an integer of 2–4.

8. The method of claim 7 wherein the quaternary ammonium hydroxide is hydroxyethyl trimethyl ammonium hydroxide.

9. The method of claim 1 wherein the substrate is treated with the ferric salt solution by immersion in the solution with agitation or by spraying.

10. The method of claim 1 wherein the aqueous TMAH solution is contacted with the substrate by immersion in the solution with agitation or by spraying.

11. The method of claim 1 wherein the aqueous solution of ferric salt contains by weight of about 5–30% of the ferric salt.

12. The method of claim 11 wherein the concentration of ferric salt is about 10–20 weight %.

13. The method of claim 1 wherein the aqueous solution of organic quarternary ammonium hydroxide is about 0.5 to 1N.

14. The method of claim 13 wherein the aqueous tetramethyl ammonium hydroxide is about 0.1N to 0.5N.

15. The method of claim 14 wherein the concentration is about 0.15N to 0.3N.

16. The method of claim 1 wherein the removal process is repeated until the desired amount of Mo debris is removed.

* * * * *